United States Patent
Kidambi et al.

(10) Patent No.: US 8,604,952 B2
(45) Date of Patent: Dec. 10, 2013

(54) MULTIPLIER-FREE ALGORITHMS FOR SAMPLE-TIME AND GAIN MISMATCH ERROR ESTIMATION IN A TWO-CHANNEL TIME-INTERLEAVED ANALOG-TO-DIGITAL CONVERTER

(75) Inventors: Sunder S. Kidambi, Austin, TX (US); Brannon Harris, Austin, TX (US)

(73) Assignee: Intersil Americas LLC, Milpitas, CA (US)

( * ) Notice: Subject to any disclaimer, the term of this patent is extended or adjusted under 35 U.S.C. 154(b) by 0 days.

(21) Appl. No.: 13/413,764

(22) Filed: Mar. 7, 2012

(65) Prior Publication Data

US 2012/0274490 A1 Nov. 1, 2012

Related U.S. Application Data

(60) Provisional application No. 61/480,702, filed on Apr. 29, 2011.

(51) Int. Cl.
*H03M 1/06* (2006.01)

(52) U.S. Cl.
USPC ............................................ 341/118; 341/155

(58) Field of Classification Search
USPC .................... 341/118, 155, 120, 156; 375/232
See application file for complete search history.

(56) References Cited

U.S. PATENT DOCUMENTS

| | | | |
|---|---|---|---|
| 7,336,729 B2 | 2/2008 | Agazzi | |
| 7,501,967 B2 | 3/2009 | Draxelmayr et al. | |
| 7,551,114 B2 | 6/2009 | Joy et al. | |
| 7,693,214 B2 | 4/2010 | Shida | |
| 7,839,313 B2 | 11/2010 | Kidambi | |
| 7,839,323 B2 | 11/2010 | Kidambi | |
| 8,063,803 B2 * | 11/2011 | Kidambi | 341/118 |

FOREIGN PATENT DOCUMENTS

WO    WO 2006/083199    8/2006

OTHER PUBLICATIONS

Goodman, J., et al., "Polyphase Nonlinear Equalization of Time-Interleaved Analog-to-Digital Converters," IEEE Journal of Selected Topics in Signal Processing 3(3):362-373, Jun. 2009.

Jamal, S.M., et al., "Calibration of Sample-Time Error in a Two-Channel Time-Interleaved Analog-to-Digital Converter," pp. 1-29, Oct. 8, 2003.

Khoini-Poorfard, R., et al., "Time-Interleaved Oversampling A/D Converters: Theory and Practice," IEEE Transactions on Circuits and Systems—II: Analog and Digital Signal Processing 44(8): 634-645. Aug. 1997.

Takashi, O., et al., "Novel Sampling Timing Background Calibration for Time-Interleaved A/D Converters," 2009 52nd IEEE International Midwest Symposium on Circuits and Systems, pp. 361-364, Aug. 2-5, 2009.

(Continued)

*Primary Examiner* — Joseph Lauture
(74) *Attorney, Agent, or Firm* — Cessari and McKenna, LLP/Intersil; David J. Thibodeau

(57) ABSTRACT

Techniques for the estimation of sample-time and gain mismatch errors in a two-channel time interleaved analog to digital converter that are devoid of any multiplication operation. In a sample-time mismatch error evaluation, the signs and the absolute values from the two ADCs are used to provide an estimate of the sample-time mismatch error. In a gain error estimation algorithm, the absolute values of the outputs from the two ADCs are subtracted and accumulated. The errors can then be corrected, in a preferred embodiment, using suitable adaptive sample time and gain correction techniques.

17 Claims, 6 Drawing Sheets

Schematic of sample-time error estimation using Eqn. 12

(56) References Cited

OTHER PUBLICATIONS

M Seo, M. J. W. Rodwell and U. Madhow, "A low computation adaptive technique for blind correction of mismatch errors in multichannel time-interleaved ADCs", IEEE international Midwest Symposium on Circuits and Systems, pp. 292-296, Sep. 2006 (Day not available).

M. Seo and M. Rodwell, "Generalized Blind Mismatch Correction for a two-channel Time-interleaved ADC: Analytic Approach", IEEE Transactions on Circuits and Systems, 2007, pp. 109-112, May 27-30, 2007.

J. Elbornsson, F. Gustaffson and J. E. Eklund, "Blind Adaptive Equalization of Mismatch Errors in a time-interleaved A/D Converter System", IEEE Transactions on Circuits and Systems-1:, vol. 51, No. 1, pp. 151-158, Jan. 2004 (Day not available).

J. Elbornsson, F. Gustaffson and J. E. Eklund, "Blind Equalization of Time Errors in a Time-Interleaved ADC System", IEEE Transactions on Signal Processing, vol. 53, No. 4, pp. 1413-1424, Apr. 2005 (Day not available).

D. Camarero, Jean-Francois Naviner and P. Loumeau, "Digital background and blind calibration for clock skew error in time-interleaved analog-go-digital converters", SBCCI, Pernambuco, Brazil, pp. 228-232, Sep. 7-11, 2004.

B. P. Ginsburg and A. P. Chandrakasan, "Dual Scalable 500MS/s, 5b Time-Interleaved SAR ADCs for UWB Applications", Department of Electrical Engineering and Computer Science, Massachusetts Institute of Technology, Cambridge, MA 02139, USA (Date not available).

M. Looney, "Advanced Digital Post-Processing Techniques Enhance Performance in Time-Interleaved ADC Systems", (Date not available).

"Multiply Your Sampling Rate with Time-Interleaved Data Converters", Application Note 989, [online] http://www/maxim-ic.com/an989, Mar. 1, 2001.

* cited by examiner

Figure 1. Spectrum of signal with sample-time mismatch error

Figure 2. Schematic of sample-time error estimation using Eqn. 12

Figure 3. Schematic of sample-time error estimation using Eqn. 18

Figure 4. Spectrum of signal with gain mismatch error

Figure 5. Schematic of gain error estimation using Eqn. 26

MULTIPLIER-FREE ALGORITHMS FOR SAMPLE-TIME AND GAIN MISMATCH ERROR ESTIMATION IN A TWO-CHANNEL TIME-INTERLEAVED ANALOG-TO-DIGITAL CONVERTER

CROSS-REFERENCE TO RELATED APPLICATION(S)

This application claims the benefit of U.S. Provisional Application Ser. No. 61/480,702 filed Apr. 29, 2011 entitled "Multiplier-Free Algorithms for Sample-Time and Gain Mismatch Error Estimation in a Two-Channel Time-Interleaved Analog-To-Digital Converter". The entire contents of the above-referenced application are hereby incorporated by reference.

BACKGROUND

Time-interleaved Analog-to-Digital Converters (TIADC) have received considerable attention in the recent past in applications that require very high sample rates, i.e., sample rates that cannot be achieved by a single present-day ADC. In a TIADC employing M ADCs, each ADC operates at $F_s/M$ where $F_s$ is the sampling rate of the TIADC. The output from each TIADC is combined at $F_s$ using a commutator to produce a sample rate converter operating at $F_s$. Ideally, the slower ADCs should have the same offset, gain, and uniform sample instants. In practice, however, due to component mismatches, this requirement is difficult to achieve. The differences in the offset values of the slower ADCs produce tones at $kF_s/M$, for $k=0,1,2,\ldots$, irrespective of the input signal. The differences in the gain values of the ADCs produce spurious (or unwanted) signals at $\pm F_{in}+kF_s/M$, for $k=1,2,\ldots$, where $F_{in}$ is any frequency of the input signal. Similarly, the non-uniformity of sampling instants of each ADC with respect to the TIADC sampling frequency produce spurious signals at exactly the same location as the spurs due to gain mismatch. However, the spurs due to the sample-time mismatch are orthogonal to those due to the gain mismatch. Consequently, the resulting spurious signals due to offset, gain and sample-time mismatches degrade the performance of the TIADC system significantly, thus making the estimation and correction of these errors imperative to improve performance.

SUMMARY

Sample-time and/or gain mismatch errors in a two-channel TIADC are estimated without using multipliers.

More specifically, in one embodiment, an input signal is first processed by at least two TIADC cores. This provides a set of, for example, two ADC outputs as first and second digital signals. At least one of the TIADC cores is provided with a correction input for receiving an error correction feedback signal; the correction feedback signal will for example, correct for at least one of sample time error and/or gain error. The correction signal is then provided to the correction input of the current TIADC core(s) that have such a correction input.

The first and second digital signals are interleaved to provide a digital representation of the input signal.

Specific to the teachings herein, the respective error is estimated from sign values determined from the first and second digital signals.

In the case where the error to be estimated is a sample time error, it can be further determined with an exclusive OR logic (XOR) operation on the sign values of the respective first and second digital signals.

For preferred embodiments herein, the error is accumulated over a predetermined number of samples of the first and second digital signals.

In one specific implementation, a sample time error is estimated using a sign operation, absolute value operation, and XOR operation on each of the first and second digital signals and can be optionally further determined as either the digital converted input signal or the negative of the converted digital input signal, depending upon the output of the respective XOR operation.

In other embodiments, the sample time error can be further estimated using an absolute value of the two digital signals. In this implementation, it is also possible to determine sample time error by delaying the second digital signal and determining the difference between the delayed second digital signal and the first digital signal. A comparison is then made between the absolute value of the first digital signal with the absolute value of the delayed second digital signal to determine the error.

In the case where the estimated error is a gain error, that estimate can be provided by a difference between an absolute value of the first digital signal and the second digital signal.

Once the error is estimated, known algorithms to correct these mismatch errors can then be applied, such as disclosed in U.S. Pat. No. 7,839,323 entitled "Error Estimation and Correction in a Two-Channel Time Interleaved Analog to Digital Converter", filed Apr. 7, 2009, which is hereby incorporated by reference in its entirety. Other correction algorithms may also be used, however.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF A PREFERRED EMBODIMENT

Figure 1:
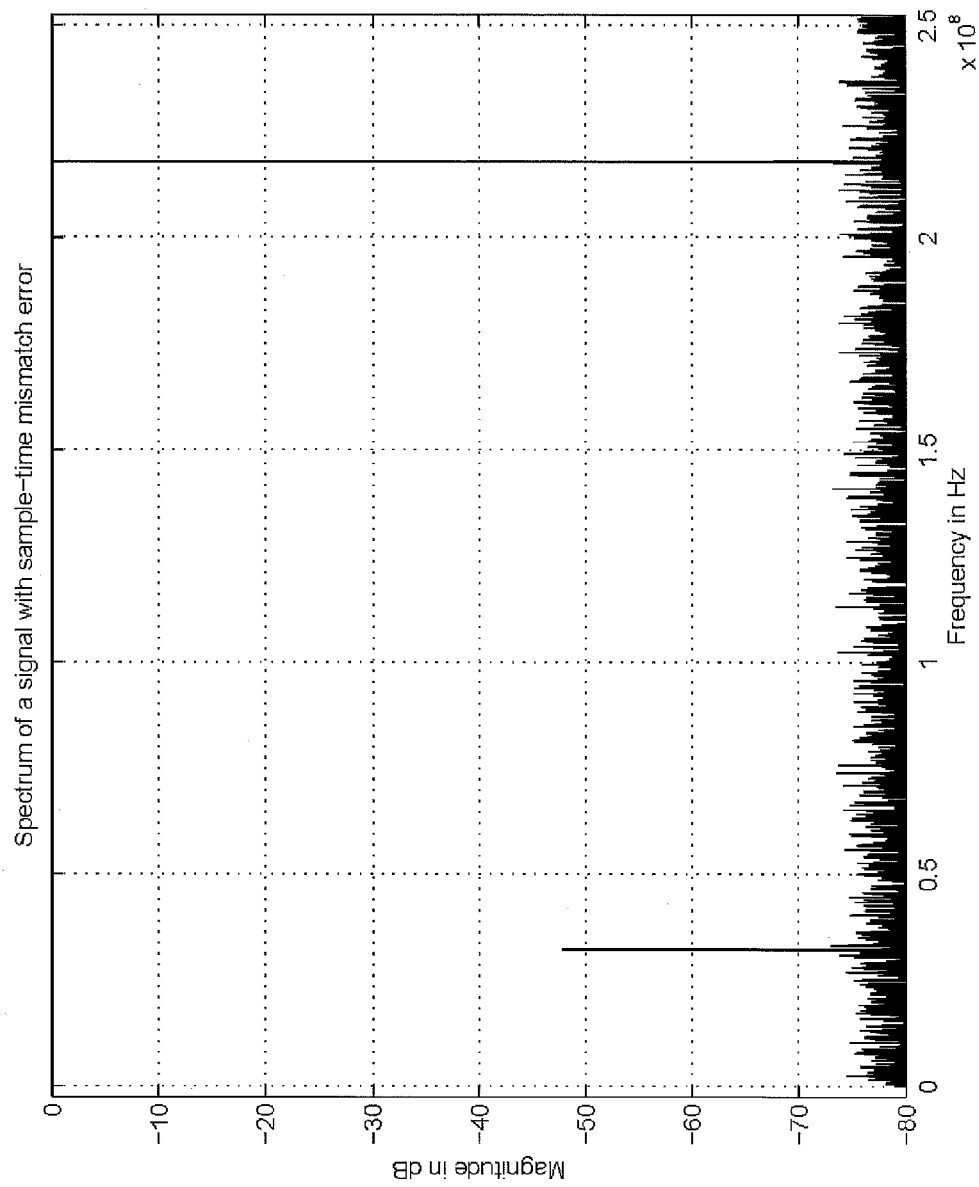
FIG. 1 illustrates a spectrum of a signal with sample-time mismatch error.

A description of example embodiments follows. While the invention is defined solely by the claims presented at the end of this document and therefore may be susceptible to embodiment in different forms, there is shown in the drawings, and will be described herein in detail, one or more specific embodiments, with the understanding that the present disclosure is to be considered but one exemplification of the principles of the invention. It is also to be understood that there is no intent to limit the invention to that which is specifically illustrated and described herein. Therefore, any references to the "invention" which may occur in this document are to be interpreted only as a reference to one particular example embodiment of but one aspect of the invention(s) claimed.

Sample-Time Mismatch Error Estimation

In this section, we consider a two-channel TIADC system with a sample-time mismatch between the two ADCs. Additionally, we assume an input signal of $x(t)=\cos(\omega_i t+\phi)$, where $\omega_i$ is an arbitrary input frequency and $\phi$ is an arbitrary phase. The output of the two-channel TIADC system is given by $$y(n) = \begin{cases} \cos(\omega_i nT + \phi) & n = \text{even} \\ \cos(\omega_i(nT + \Delta t) + \phi) & n = \text{odd} \end{cases} \quad (1)$$

where $T=1/F_s$ and $F_s$ is the sampling frequency of the two-channel TIADC system. Combining the even and odd time instants in the above equation, we have $$y(n) = \cos\left(\omega_i\left[nT + \frac{\Delta t}{2} - (-1)^n \frac{\Delta t}{2}\right] + \phi\right) \quad (2)$$

Let us assume that the outputs corresponding to even time instants be output from ADC1 while those corresponding to odd time instants be output from ADC2. In other words, ADC1 samples the input signal at time instants $2nT$ while ADC2 samples the input signal at time instants $(2n+1)T+\Delta t$. Consequently, $\Delta t$ is the sample-time error. It must be mentioned that there is no loss of generality in grouping the total phase in one of the outputs. The above equation can be expanded as $$y(n) = \cos\left(\omega_i\left[nT + \frac{\Delta t}{2}\right] + \phi\right)\cos\left((-1)^n \omega_i \frac{\Delta t}{2}\right) + \\ \sin\left(\omega_i\left[nT + \frac{\Delta t}{2}\right] + \phi\right)\sin\left((-1)^n \omega_i \frac{\Delta t}{2}\right) \quad (3)$$

It can be seen that $\cos((-1)^n \omega_i \Delta t/2)=\cos(\omega_i \Delta t/2)$. Since sin is an odd function, with $(-1)^n=\cos(n\pi)$, we get $\sin((-1)^n \omega_i \Delta t/2)=\cos(n\pi)\sin(\omega_i \Delta t/2)$. Using $\sin(a)\cos(n\pi)=\sin(a-n\pi)$ and $n\pi=\omega_s nT/2$, the above equation can be written as $$y(n) = \cos\left(\omega_i \frac{\Delta t}{2}\right)\cos\left(\omega_i nT + \omega_i \frac{\Delta t}{2} + \phi\right) + \\ \sin\left(\omega_i \frac{\Delta t}{2}\right)\sin\left(\omega_i nT + \omega_i \frac{\Delta t}{2} - \frac{\omega_s}{2}nT + \phi\right) \\ = \cos\left(\omega_i \frac{\Delta t}{2}\right)\cos\left(\omega_i nT + \omega_i \frac{\Delta t}{2} + \phi\right) + \\ \sin\left(\omega_i \frac{\Delta t}{2}\right)\sin\left(\left(\omega_i - \frac{\omega_s}{2}\right)nT + \omega_i \frac{\Delta t}{2} + \phi\right) \quad (4)$$

Assuming that $\Delta t$ is very small compared to T, $$\cos\left(\omega_i \frac{\Delta t}{2}\right) \approx 1 \text{ and } \sin\left(\omega_i \frac{\Delta t}{2}\right) \approx \omega_i \frac{\Delta t}{2}.$$

Consequently, $$y(n) \approx \cos\left(\omega_i nT + \omega_i \frac{\Delta t}{2} + \phi\right) + \quad (5)$$

$$\left(\omega_i \frac{\Delta t}{2}\right)\sin\left(\left(\omega_i - \frac{\omega_s}{2}\right)nT + \omega_i \frac{\Delta t}{2} + \phi\right)$$

$$\approx \underbrace{\cos\left(\omega_i nT + \omega_i \frac{\Delta t}{2} + \phi\right)}_{\text{Input}} - \quad (6)$$

$$\underbrace{\left(\omega_i \frac{\Delta t}{2}\right)\sin\left(\left(\frac{\omega_s}{2} - \omega_i\right)nT - \omega_i \frac{\Delta t}{2} - \phi\right)}_{\text{Image}}$$

We can now see from the above equation that the phase error produces an image tone with an amplitude proportional to the sample mismatch timing $\Delta t$.

FIG. 1 shows one example of this. Here, the input signal was a 217.8 MHz tone with a sample frequency of 500 MHz. An image spur occurs at 32.2 MHz.

As is well known, a correlation between two sequences provides information about the sample-time delay between them. Towards this end, we define two sequences, $y_1(n)$ and $y_2(n)$, as the outputs from ADC1 and ADC2, respectively. Consequently $$y_1(n)=y(2n) \quad (7)$$

$$y_2(n)=y(2n+1) \quad (8)$$

We now define a sample-time mismatch error as $$e_{phase}(\Delta t) = \sum_{k=1}^{N-1} \{y_1(n+1-k)y_2(n+1-k) - y_2(n+1-k)y_1(n-k)\} \quad (9)$$

where N is the number of samples from each of the ADCs used in the evaluation of $e_{phase}(\Delta t)$. It can be seen from the above equation, the product of the outputs from both ADCs are used in the evaluation of $e_{phase}(\Delta t)$. Moreover, each of these products use a multiplier that needs to operate at $F_s/2$. As the sample frequency increases, the multiplication operation becomes commensurately expensive.

In the adaptive algorithm for sample-time mismatch correction in a previously-disclosed patent, only the sign of $e_{phase}(\Delta t)$ is used in the adaptation. Hence, $$\text{sign}(e_{phase}(\Delta t)) = \quad (10)$$

$$\text{sign}\left(\sum_{k=1}^{N-1} y_1(n+1-k)y_2(n+1-k) - y_2(n+1-k)y_1(n-k)\right)$$

The above equation can be written as $$\text{sign}(e_{phase}(\Delta t)) = \quad (11)$$

$$\text{sign}\left(\sum_{k=1}^{N-1} \text{sign}(y_1(n+1-k))\text{sign}(y_2(n+1-k))|y_1(n+1-k)| \\ |y_2(n+1-k)| - \\ \text{sign}(y_2(n+1-k))\text{sign}(y_1(n-k))|y_2(n+1-k)||y_1(n-k)|\right)$$

With extensive simulation it has been seen that $$\text{sign}(e_{phase}(\Delta t)) = \text{sign}\left(\sum_{k=1}^{N-1} \text{sign}(y_1(n+1-k))\right. \tag{12}$$
$$\text{sign}(y_2(n+1-k))\min(|y_1(n+1-k)|, |y_2(n+1-k)|) -$$
$$\left.\text{sign}(y_2(n+1-k))\text{sign}(y_1(n-k))\min(|y_2(n+1-k)|, |y_1(n-k)|)\right)$$

provides the same effect as Eqn. 11. It can be observed from the above equation that the evaluation of the sign of $e_{phase}(\Delta t)$ does not require any multiplication operation. The multiplication of the signs of the outputs from the two ADCs can be XORed to obtain their product. Based on the XORed result, the sign of the minimum of the outputs from the two ADCs can be chosen.

Figure 2:
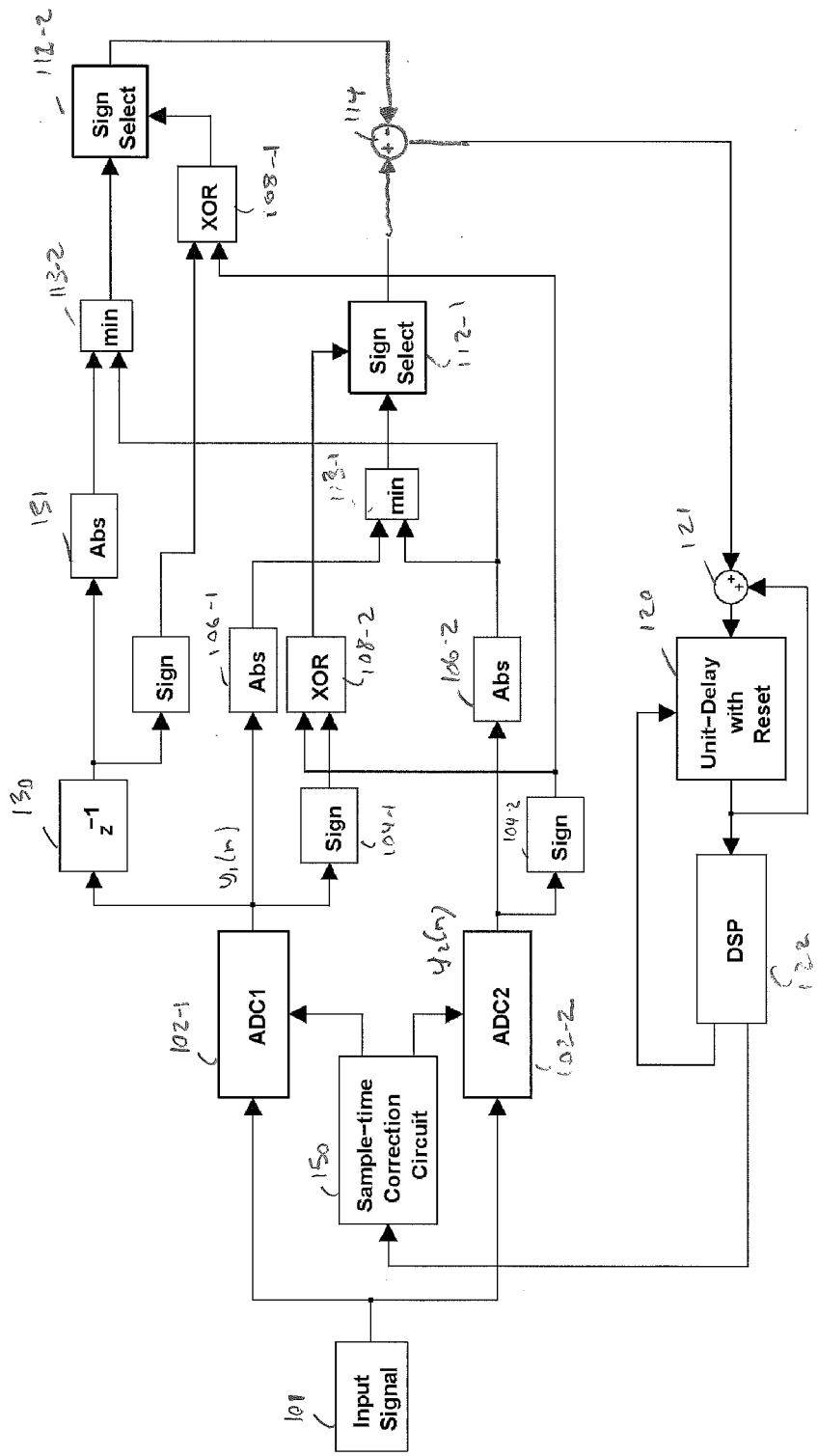
FIG. 2 is a schematic of a sample-time error estimation block using Eqn. 12.

FIG. 2 shows a schematic of the sample-time error estimation signal processing operations suggested by Eqn. 12. An input signal 101 is fed to two interleaved ADC cores (102-1, 102-2). The outputs $y_1(n)$ and $y_2(n)$ of the two ADC cores 102-1, 102-2 (ADC1, ADC2) are each subjected to a respective sign operation (104-1, 104-2) and then an absolute value operation (106-1, 106-2). The outputs of the sign operation (104-1, 104-2) feed a respective XOR operation (108-1, 108-2). A respective block Sign Select (112-1, 112-2) associated with each ADC 102-1, 102-2 then provides either the digital converted input signal or the negative of the digital converted input signal depending on the output of the corresponding XOR block (108-1, 108-2). The signals from the Sign Select blocks (112-1, 112-2) are subtracted 114 from one another, in accordance with Eqn. 12. The output from this subtraction is then accumulated in the integrator 120, 121 (unit-delay-with-reset) for N samples of each ADC. The output of the integrator is then fed to the DSP 122. The DSP 122 provides a reset signal to the unit-delay-with-reset block to reset the initial value of the unit delay.

An adaptive sample time error correction algorithm, such as presented in the above-referenced issued patent or some other error correction is then performed by the DSP block 122 which provides the appropriate sample-time correction values to the sample-time correction circuit 150. This block then effects the appropriate delays in the two ADCs to correct the sample-time mismatch between the two ADCs.

It may be observed that Eqn. 9 can be simplified as $$e_{phase}(\Delta t) = \sum_{k=1}^{N-1} y_2(n+1-k)\{y_1(n+1-k) - y_1(n-k)\} \tag{13}$$

Again, on the lines of Eqn. 12, Eqn. 13 becomes $$\text{sign}(e_{phase}(\Delta t)) = \tag{14}$$
$$\text{sign}\left(\sum_{k=1}^{N-1} \text{sign}(y_2(n+1-k))\text{sign}(y_1(n+1-k) - y_1(n-k))\right.$$
$$\left.\min(|y_2(n+1-k)|, |y_1(n+1-k) - y_1(n-k)|)\right)$$

Another expression for sample-time mismatch error can be written as $$\text{sign}(e_{phase}(\Delta t)) = \tag{15}$$
$$\text{sign}\left(\sum_{k=1}^{N-1} \{y_1(n+1-k) - y_2(n+1-k)\}^2 \{y_2(n+1-k) - y_1(n-k)\}^2\right)$$

The above equation can be written as $$\text{sign}(e_{phase}(\Delta t)) = \text{sign}\left(\sum_{k=1}^{N-1} \text{sign}(y_1(n+1-k) - y_2(n+1-k))\right. \tag{16}$$
$$\text{sign}(y_1(n+1-k) - y_2(n+1-k))$$
$$|y_1(n+1-k) - y_2(n+1-k)||y_1(n+1-k) - y_2(n+1-k)| -$$
$$\text{sign}(y_2(n+1-k) - y_1(n-k))\text{sign}(y_2(n+1-k) - y_1(n-k))$$
$$\left.|y_2(n+1-k) - y_1(n-k)||y_2(n+1-k) - y_1(n-k)|\right)$$

Since $$(\text{sign}(y_1(n+1-k) - y_2(n+1-k)))^2 = \tag{17}$$
$$(\text{sign}(y_2(n+1-k) - y_1(n-k)))^2 = 1$$

it has been seen through extensive simulations that the following equation provides the same effect as Eqn. 16.

$$\text{sign}(e_{phase}(\Delta t)) = \tag{18}$$
$$\text{sign}\left(\sum_{k=1}^{N-1} |y_1(n+1-k) - y_2(n+1-k)| - |y_2(n+1-k) - y_1(n-k)|\right)$$

It can be seen from Eqn. 18 that there is no multiplication operation involved in the evaluation of the sign of $e_{phase}(\Delta t)$.

Figure 3:
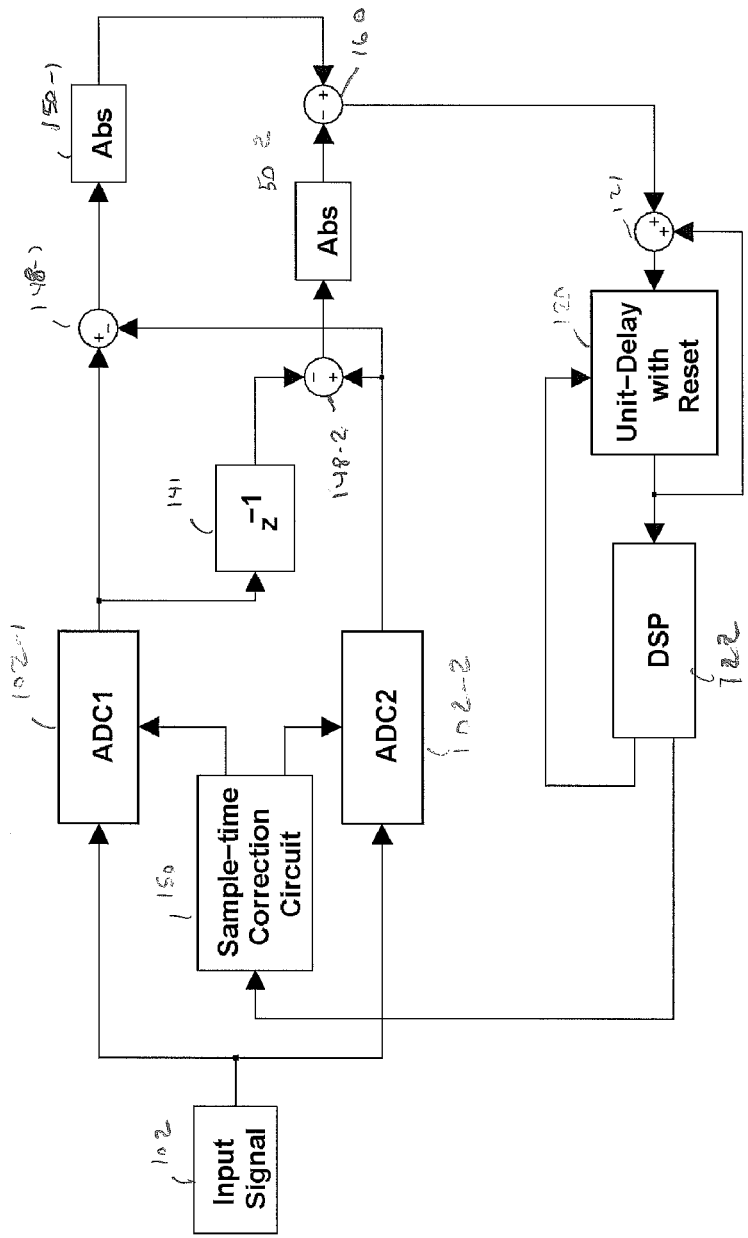
FIG. 3 is a schematic of a sample-time error estimation block using Eqn. 18.

FIG. 3 shows a schematic of a sample-time error estimation block using Eqn. 18. It can be seen that the absolute values (150-1, 150-2) of the difference 148-1 and delayed difference 148-2 between the outputs of the two ADCs (102-1, 102-1) are subtracted 160 in accordance with Eqn. 18. The error is accumulated (120, 121) and then corrected by the DSP 122 and sample time correction circuit 150 of the FIG. 2 embodiment.

Gain Error Estimation

In this section, we consider the two-channel TIADC with only a gain error between the two ADCs. Assuming an input signal of $x(t) = \cos(\omega_o t + \phi)$, the output of the TIADC is given by $$y(n) = \begin{cases} G_1 \cos(\omega_o nT + \phi) & n = \text{even} \\ G_2 \cos(\omega_o nT + \phi) & n = \text{odd} \end{cases} \tag{19}$$

where $G_1$ and $G_2$ are the gain values in ADC1 and ADC2, respectively. Here ADC1 and ADC2 are the two ADCs in a two-channel TIADC. Combining the output at even and odd time instants, we get $$y(n) = G_1\cos(\omega_o nT + \phi) - (1-(-1)^n)G_d\cos(\omega_o nT + \phi) \qquad (20)$$
$$= [G_s + (-1)^n G_d]\cos(\omega_o nT + \phi)$$

where $$G_s = \frac{G_1 + G_2}{2} \qquad (21)$$

$$G_d = \frac{G_1 - G_2}{2} = \frac{G_1}{2}\left(1 - \frac{G_2}{G_1}\right) \qquad (22)$$

Using $$(-1)^n = \cos\left(\frac{\omega_s}{2}nT\right),$$

eqn. 20 can be re-written as $$y(n) = G_s\cos(\omega_o nT + \phi) + G_d\cos\left[\left(\omega_o - \frac{\omega_s}{2}\right)nT + \phi\right] \qquad (23)$$

It is evident from the above equation that the gain mismatch produces an image tone reflected around $\omega_s/2$ and the amplitude of the tone is proportional to the difference in gain values between the two ADCs.

Figure 4:
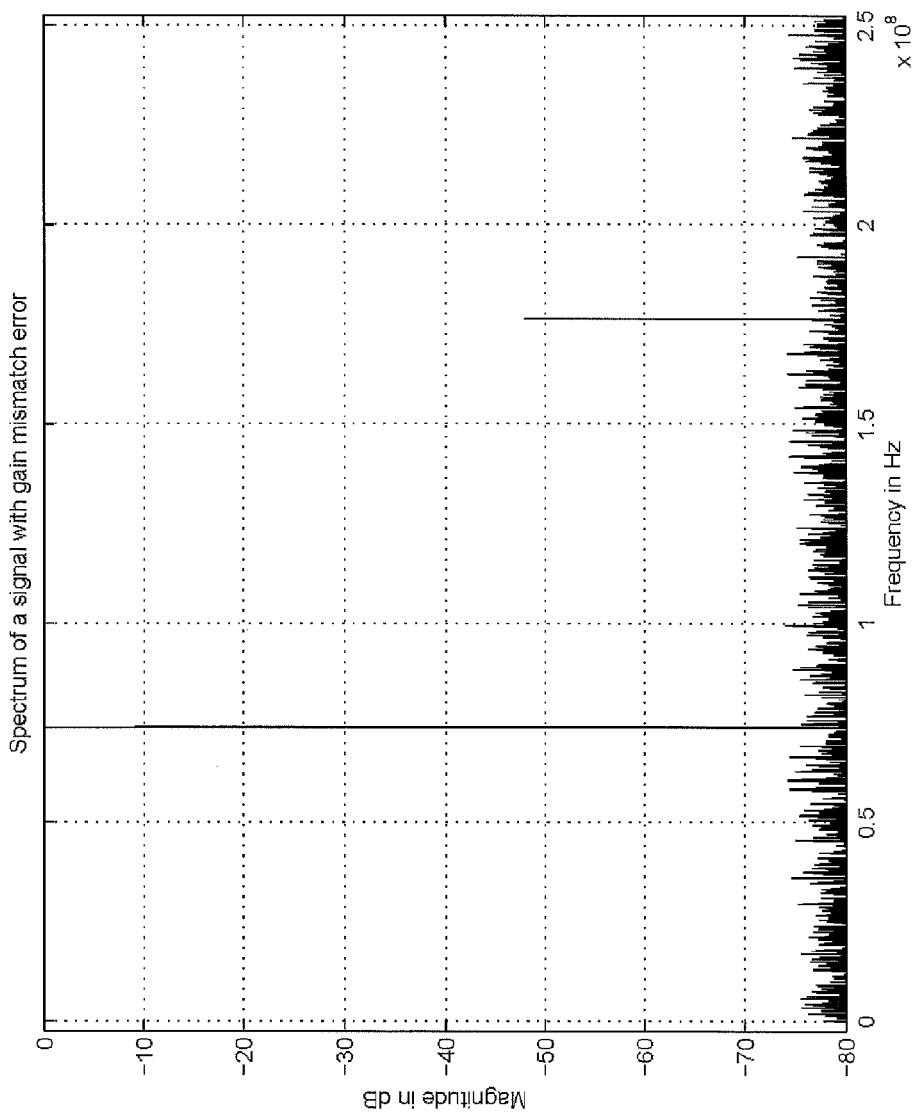
FIG. 4 is a spectrum of a signal with gain mismatch error.

FIG. 4 shows the spectrum of an example signal which has a gain mismatch error. The example input signal is a 73.65 MHz tone with a sample frequency of 500 MHz. The image spur occurs around 176.35 MHz.

The minimization of the difference in gain values between the two ADCs can be accomplished by minimizing the difference in power of the signals on the two ADCs. Towards this end, an objective function is formulated as $$e_{gain}(n) = \sum_{k=0}^{N-1} y_1(n-k)^2 - y_2(n-k)^2 \qquad (24)$$

where $y_1(n)$ and $y_2(n)$ are the outputs from ADC1 and ADC2, respectively. By driving $e_{gain}(n)$ close to zero, the gains of the two ADCs are approximately equal. In other words $G_1$ $G_2$. As can be seen from Eqn. 24, the evaluation of $e_{gain}(n)$ entails squaring operation of each output from the two ADCs.

The adaptive algorithms developed in the issued patent use the sign of $e_{gain}(n)$ in the adaptation. Thus, $$\text{sign}(e_{gain}(n)) = \text{sign}\left(\sum_{k=0}^{N-1} y_1(n-k)^2 - y_2(n-k)^2\right) \qquad (25)$$

Using the same rationale as in Eqn. 18, the following equation provides the same effect as Eqn. 25

$$\text{sign}(e_{gain}(n)) = \text{sign}\left(\sum_{k=0}^{N-1} |y_1(n-k)| - |y_2(n-k)|\right) \qquad (26)$$

in terms of gain error convergence. It can be seen from Eqn. 26 that the estimation of $e_{gain}$ does not entail any multiplication operation. The difference of the absolute values from the two ADCs is summed over N samples and the sign of this sum is used in the adaptive algorithm.

Figure 5:
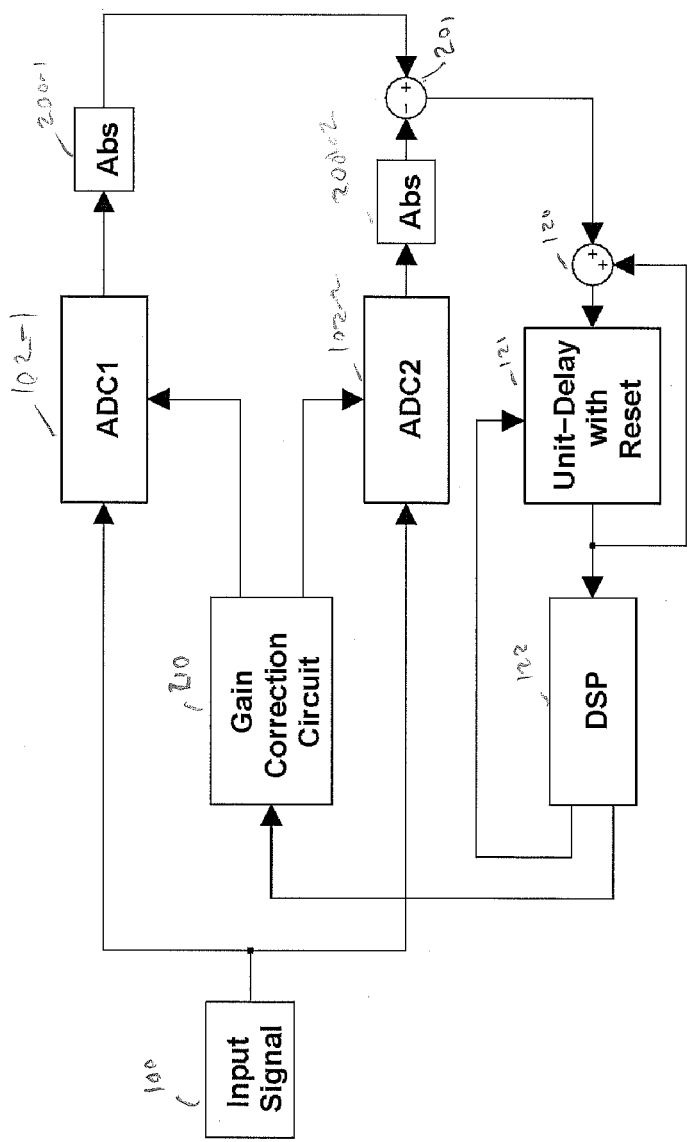
FIG. 5 is a schematic of a gain error estimation block using Eqn. 26.

FIG. 5 shows a schematic of one embodiment of the gain error estimation block. The outputs from each of the two ADCs 102-1, 102-2 (ADC1, ADC2) are input to a corresponding block 200-1, 200-2 that outputs the corresponding absolute values. The difference 201 of the absolute values is then integrated 120. After a total of N differences are added, the output is sent to a Digital Signal Processor (DSP) 122. A trigger signal from the DSP 122 is sent to a unit-delay-with-reset block 121 to reset the initial value of the unit-delay to zero. The DSP 122 then performs the adaptive gain correction algorithm that was presented in the above-referenced issued patent (or some other correction algorithm). The output of the adaptive correction algorithm is then used to correct the gain differences between the two ADCs using gain circuit 210.

The above teachings with respect to analog to digital converters have wide application in the filed of electronic devices and systems. One example system is a digital signal transceiver. In such a system, the receiver may include front end analog signal processing components such as amplifiers, filters, and downconverters. A time interleaved analog to digital converter uses two or more subunit converters to provide a digital signal representative of the received signal(s) of interest. Digitizing the entire receive bandwidth of interest may require a very high sampling rate; therefore, an interleaved system as described above may provide advantages over other conversion techniques.

Figure 6:
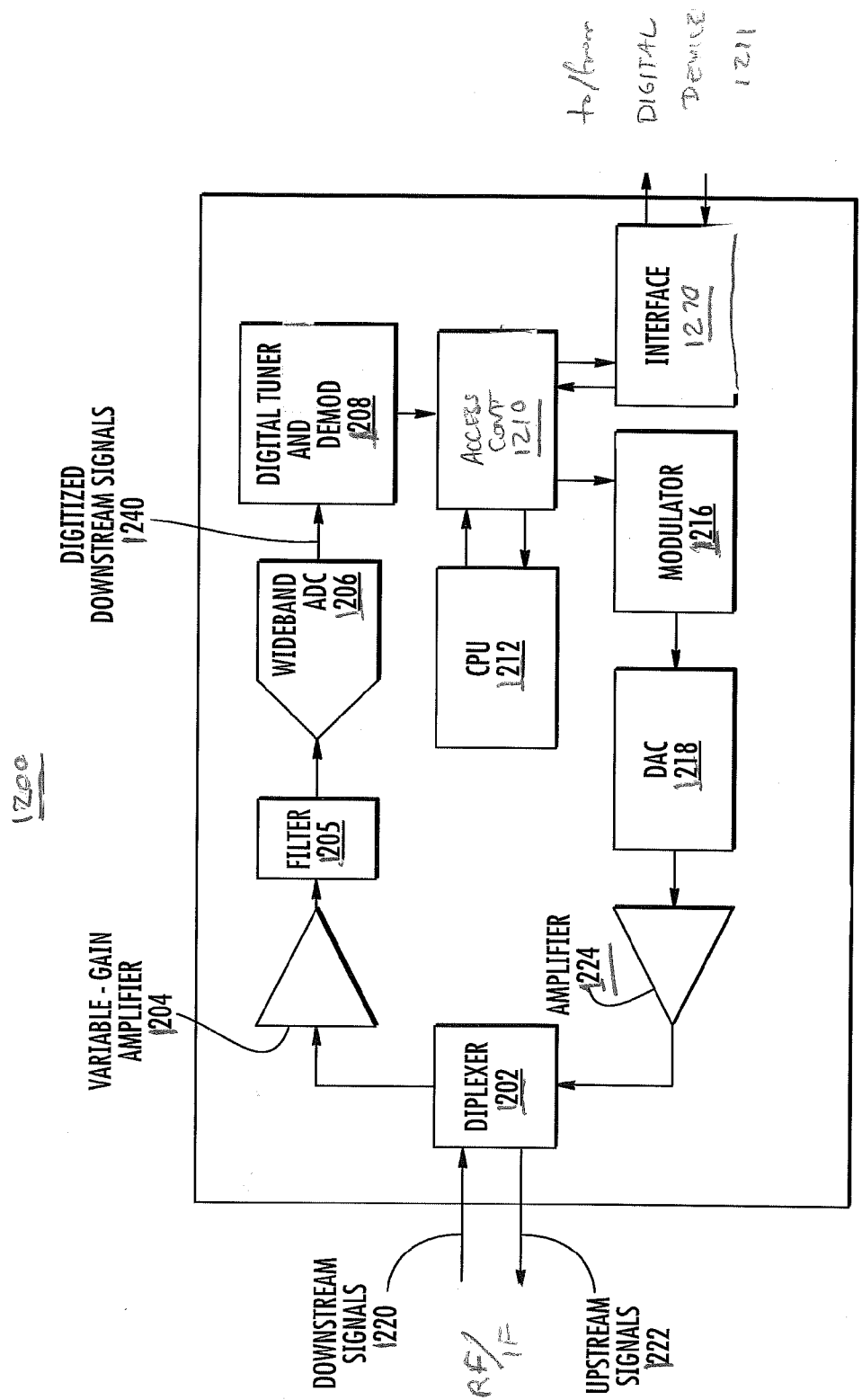
FIG. 6 illustrates use of TIADC in a digital transceiver.

FIG. 6 shows one such example transceiver system 1200 connected to transmit and receive a radio frequency (RF) signal. The RF signal may be a wireless signal received from an antenna or maybe received on a wire such as from a coaxial, optical fiber, or its like. The transceiver 1200 transmits data to and receives data from a digital device 1211 such as a computer, telephone, television, camera or any number of digital devices.

The transceiver 1200 shown in FIG. 6 uses a wideband, time-interleaved, analog-to-digital converter (ADC) 1206 as taught herein to digitize received signals. The output from the wideband ADC 1206 can be tuned digitally, rather than with analog tuners, resulting in lower power consumption compared to alternative methods.

More particularly, in the example system 1200, signals are coupled via a diplexer 1202, which separates downstream (received) signals 1220 from upstream (transmitted) signals 1222. The diplexer 1202 directs the received signal to a variable-gain amplifier (VGA) 1204, which amplifies the received signal before transmitting it through a filter 1205 to a wideband ADC 1206. The time-interleaved ADC 1206 digitizes the received signal, then passes the digitized signal 1240 to a digital tuner and demodulator 1208. These demodulated signals may then be fed through access control 1210 and then to a digital interface 1270.

A complete digital transceiver 1200 also typically includes corresponding transmit components such as modulator 1216, digital to a converter 1218 and amplifier 1224. A CPU internal to the transceiver 1200 may further control its operation. It should also be understood that other components not shown here, such as up converters and down converters may form part of transceiver 1200.

Those of skill will further appreciate that the various illustrative components, logical blocks, signal processing blocks, modules, circuits, and algorithm steps described in connection with the embodiments disclosed above may be implemented as analog or digital electronic hardware, or as computer software, or as combinations of the same. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative components, logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

While this invention has been particularly shown and described with references to example embodiments thereof, it will be understood by those skilled in the art that various changes in form and details may be made therein without departing from the scope of the invention encompassed by the appended claims.

What is claimed is:

1. A method comprising:
   converting an input signal with two Time-Interleaved Analog to Digital Converters (TIADC) cores, to provide to a set of two ADC outputs as first and second digital signals, at least one of the TIADC cores having a correction input;
   interleaving the first and second digital signals to form a digital converted representation of the input signal;
   estimating an error using sign values determined from the first and second digital signals;
   determining a correction signal from the error;
   applying the correction signal to the correction input of at least one of the TIADC cores;
   wherein the error is a sample time error; and
   wherein the sample time error is further determined from an exclusive-OR of the sign values of the first and second digital signals.

2. The method of claim 1 wherein the sample time error is further determined from a sign of a minimum of the first and second digital signals.

3. The method of claim 1 wherein the error is accumulated over a pre-determined number, N, of samples of the first and second digital signals.

4. The method of claim 1 wherein the sample-time error is determined by performing a sign operation, absolute value operation, and XOR operation on each of the first and second digital signals.

5. The method of claim 4 wherein the sample-time error is further determined from either the digital converted input signal or the negative of the digital converted input signal depending on the output of a respective XOR operation.

6. The method of claim 1 wherein signals from a pair of sign select blocks are subtracted from one another to determine the sample-time error.

7. A method comprising:
   converting an input signal with two Time-Interleaved Analog to Digital Converters (TIADC) cores, to provide to a set of two ADC outputs as first and second digital signals, at least one of the TIADC cores having a correction input;
   interleaving the first and second digital signals to form a digital converted representation of the input signal;
   estimating an error using sign values determined from the first and second digital signals;
   determining a correction signal from the error;
   applying the correction signal to the correction input of at least one of the TIADC cores;
   wherein the error is a sample time error; and
   wherein the sample time error is estimated from a difference between absolute values of the two digital signals.

8. A method comprising:
   converting an input signal with two Time-Interleaved Analog to Digital Converters (TIADC) cores, to provide to a set of two ADC outputs as first and second digital signals, at least one of the TIADC cores having a correction input;
   interleaving the first and second digital signals to form a digital converted representation of the input signal;
   estimating an error using sign values determined from the first and second digital signals;
   determining a correction signal from the error;
   applying the correction signal to the correction input of at least one of the TIADC cores;
   wherein the error is a sample time error; and wherein the sample time error is determined by further:
   delaying the second digital signal to provide a delayed second digital signal;
   determining a difference between the delayed second digital signal and the first digital signal; and
   comparing the sign of the first digital signal with a sign of the delayed second digital signal to determine the error.

9. A method comprising:
   converting an input signal with two Time-Interleaved Analog to Digital Converters (TIADC) cores, to provide to a set of two ADC outputs as first and second digital signals, at least one of the TIADC cores having a correction input;

interleaving the first and second digital signals to form a digital converted representation of the input signal;
estimating a gain error using values determined from the first and second digital signals;
determining a correction signal from the gain error;
applying the correction signal to the correction input of at least one of the TIADC cores: and
wherein the gain error is further estimated from a difference between an absolute value of the first digital signal and the second digital signal.

10. An aparatus comprising:
two Time-Interleaved Analog to Digital Converter (TIADC) cores, providing a set of two ADC outputs as first and second digital signals, at least one of the TIADC cores having a correction input;
a signal interleaver for combining the first and second digital signals to form a digital converted representation of the input signal;
at least two sign blocks, to determine respective sign values of the first and second digital signals;
a digital signal processing operator, for estimating a sample time error from the first and second respective sign values to provide a correction signal;
wherein the correction signal is further connected to the correction input of at least one of the TIADC cores; and further comprising:
an exclusive or block, connected to receive the sign values of the first and second digital signals, and to thereby further provide the correction signal.

11. The apparatus of claim 10 further comprising: an accumulator, for accumulating samples of the correction signal over a predetermined number N, of samples of the first and second digital signals.

12. The apparatus of claim 10 wherein the digital signal processing operator further comprises, on each of the first and second digital signals:
a sign operation;
an absolute value operation; and
an XOR operation.

13. The apparatus of claim 12 wherein the digital signal processing operator further comprises:
a selector, for selecting either the digital converted input signal or the negative of the digital converted input signal depending upon the output of at least one of the XOR operations.

14. The apparatus of claim 10 wherein the TIADC cores are connected to receive a radio frequency signal and form part of a digital transceiver.

15. An aparatus comprising:
two Time-Interleaved Analog to Digital Converter (TIADC) cores, providing a set of two ADC outputs as first and second digital signals, at least one of the TIADC cores having a correction input;
a signal interleaver for combining the first and second digital signals to form a digital converted representation of the input signal;
at least two sign blocks, to determine respective sign values of the first and second digital signals;
a digital signal processing operator, for estimating an error from the first and second respective sign values to provide a correction signal;
wherein the correction signal is further connected to the correction input of at least one of the TIADC cores;
wherein the error is a gain error and further wherein:
the digital signal processing operator determines a difference between the absolute values of the first and second digital signals.

16. The apparatus of claim 15 further comprising:
an accumulator, for accumulating a predetermined number of samples, N of the first and second digital signals.

17. A programmable computer product for use with a multiple channel time interleaved analog to digital converter (TIADC) comprising two TIADC cores, the TIADC cores respectively providing first and second digital signals, wherein the first and second digital signals are interleaved to form a digital converted representation of an input signal, the programmable computer product comprising one or more programmable data processing machines that retrieve instructions from a stored media and execute the instructions, the instructions for:
estimating a sample time error using values determined from the first and second digital signals;
determining a correction signal from the error; and
applying the correction signal to the correction input of at least one of the TIADC cores; and
wherein the sample time error is further estimated from a difference between absolute values of the two digital signals.

* * * * *